United States Patent [19]
Freund et al.

[11] Patent Number: 5,859,086
[45] Date of Patent: Jan. 12, 1999

[54] LIGHT DIRECTED MODIFICATION FLUOROPOLYMERS

[75] Inventors: Michael S. Freund, Allentown; Lisa M. Regalla, Latrobe, both of Pa.; Gang Liu, Bristol, Conn.

[73] Assignee: Competitive Technologies of PA, Inc., Bethlehem, Pa.

[21] Appl. No.: 906,658

[22] Filed: Aug. 7, 1997

Related U.S. Application Data

[60] Provisional application No. 60/023,563 Aug. 4, 1996.
[51] Int. Cl.$^6$ ............................... C08K 5/04; B05D 3/00
[52] U.S. Cl. ............................... 522/83; 528/503; 524/81; 522/84; 522/86; 522/146; 522/162; 427/444; 427/532; 427/539; 427/542; 427/553; 427/581; 427/595
[58] Field of Search ............................... 528/503; 524/81; 522/86, 83, 146, 84, 162; 427/444, 532, 539, 542, 553, 581, 595

[56] References Cited

U.S. PATENT DOCUMENTS

| | | | |
|---|---|---|---|
| 3,910,187 | 10/1975 | Cords | 101/450.1 |
| 4,879,176 | 11/1989 | Ouderkirk et al. | 428/323 |
| 5,051,312 | 9/1991 | Allmer | 428/458 |
| 5,069,926 | 12/1991 | Iwata et al. | 427/40 |
| 5,156,780 | 10/1992 | Kenigsberg et al. | 264/22 |
| 5,209,849 | 5/1993 | Hu et al. | 210/490 |
| 5,229,172 | 7/1993 | Cahalan et al. | 427/536 |
| 5,362,525 | 11/1994 | Nishii et al. | 427/554 |
| 5,532,304 | 7/1996 | Miyazaki et al. | 524/261 |
| 5,540,837 | 7/1996 | Lunkwitz et al. | 210/490 |
| 5,555,549 | 9/1996 | Nakaishi | 378/64 |
| 5,630,941 | 5/1997 | Burger et al. | 210/490 |
| 5,721,293 | 2/1998 | Ichinose et al. | 522/130 |

OTHER PUBLICATIONS

Fox, H.W., Zinsman, W.A., "The Spreading of Liquids on Low-Energy Surfaces II–Modified Tetrafluoroethylene Polymers" Journal of Colloid Science, 1952, 7, pp. 109–121.

Nelson, E.R., Kilduff, T.J., Benderly, A.A., "Bonding to Teflon" Industrial and Engineering Chemistry, 1957, 50, pp. 329–330.

Dwight, D.W., Riggs, W.M., "Fluoropolymer Surface Studies" Journal of Colloid and Interface Science, 1974, 47(3), pp. 650–660.

Ha, K., McClain, S., Suib, S.L., Garton, A., "Adhesion to Sodium Naphthalenide Treated Fluoropolymers Part I –Analytical Methodology" Journal of Adhesion, 1991, 33, pp. 169–184.

Marchesi, J.T., Ha, K., Garton, A., Swei, G.S., Kristal, K.W., "Adhesion to Sodium Naphthalenide Treated Fluoropolymers Part II–Effects of Treatment Conditions and Pluoropolymer Structure" Journal of Adhesion, 1991, 36, pp. 55–69.

Marchesi, J.T., Keith, H.D., Garton, A., "Adhesion to Sodium Naphthalenide Treated Fluoropolymers Part III – Mechanism of Adhesion" Journal of Adhesion, 1992, 39, pp. 185–205.

Tasker, S., Chambers, R.D., Badyal, J.P.S., "Surface Defluorination of PTFE by Sodium Atoms" Journal of Physical Chemistry, 1995, 98, pp. 12442–12446.

Lunkwitz, K., Burger W., Lappan, U., Brink, H.J., Ferse, A., "Surface Modification of Fluoropolymers" Journal of Adhesion Science and Technology, 1995, 9(3), pp. 297–310.

Hung, M.H., Burch, R.R., "Functionalization and Metallization of Fluoropolymer Surfaces through Reduction" Journal of Applied Polymer Science, 1995, 55, pp. 549–559.

Kiss, E., Samu, J., Toth, A., Bertoti, I., "Novel Ways of Covalent Attachment of Poly(ethylene oxide) onto Polyethylene: Surface Modification and Characterization by XPS and Contact Angle Measurements" Langmuir, 1996, 12, pp. 1651–1657.

*Primary Examiner*—Samuel A. Acquah
*Attorney, Agent, or Firm*—Michael R. Novack

[57] ABSTRACT

A method is disclosed for modifying a fluoropolymer including the following steps: providing a fluoropolymer surface, adding a solution including a a reactive species to the fluoropolymer surface, and exposing the reduced fluoropolymer surface to ultraviolet radiation in the presence of ozone or oxygen. The method reduces the discoloration of the fluoropolymer.

16 Claims, 9 Drawing Sheets

FIG. 7A
mask
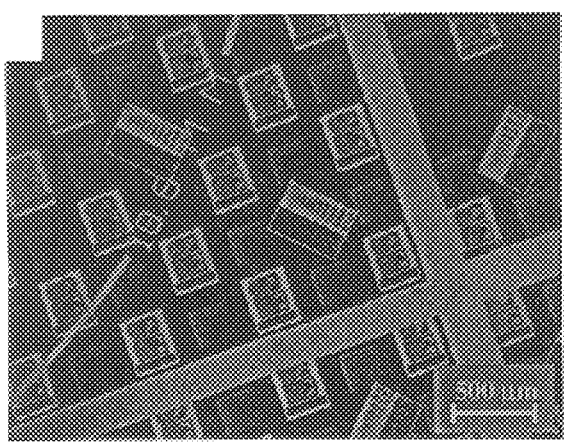
FIG. 7B
modified
fluoropolymer
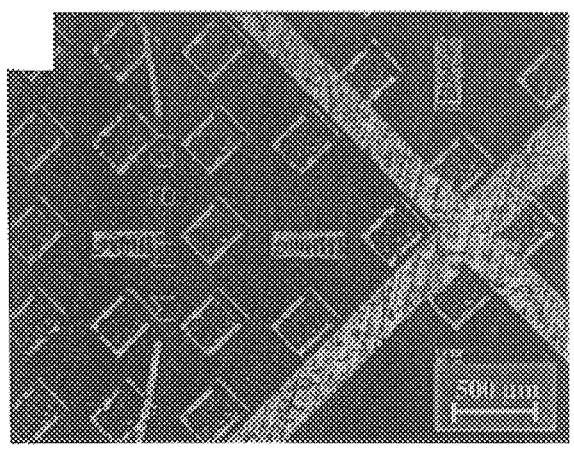
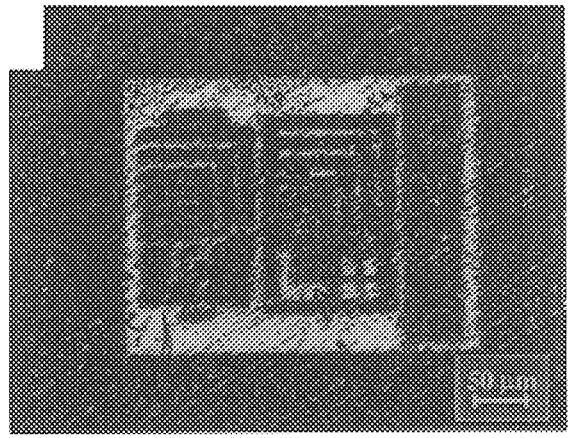
FIG. 7C

LIGHT DIRECTED MODIFICATION FLUOROPOLYMERS

RELATED APPLICATION

This application claims priority from U.S. Provisional Application Ser. No. 60/023,563 filed Aug. 7, 1996, and said U.S. Provisional Application is incorporated herein by reference.

FIELD OF THE INVENTION

This invention relates to a method for light directed chemical modification of fluoropolymers, and more particularly to reducing discoloration and improving wetting characteristics of fluoropolymer surfaces.

BACKGROUND OF THE INVENTION

There is currently much interest in using fluoropolymers in a wide variety of applications. For example, fluoropolymers are used as circuit board material because of their chemical and mechanical properties. Fluoropolymers are also used in medical environments, again because of their useful chemical and mechanical properties However, the dark brown color of reduced fluoropolymer surfaces (used for good adhesion) has been deemed undesirable since discoloration is often associated with dirty materials. Further, such discoloration inhibits the ability to easily identify true contamination. As a result, considerable time and money has been directed toward alternative methods including plasma modification which results in surfaces with enhanced adhesion properties without discoloration. The major drawback of plasma treatments is that they require a significant financial investment in the construction and maintenance of large vacuum chambers and specialty gases. Furthermore, vacuum chambers are incompatible with continuous processing.

SUMMARY OF THE INVENTION

The present invention provides a technique for reducing a fluorpolymer surface. The fluoropolymer is first exposed to a solution comprising a reactive species to form a reduced fluoropolymer surface. The fluoropolymer surface is then exposed to excited oxygen from, for example, air, supplied oxygen, or supplied ozone. The excited oxygen species reacts with the reduced fluoropolymer producing a surface that exhibits a decreased contact angle of water (which corresponds to an increased work of adhesion). The decreased unsaturation of the reduced fluorpolymer resulting from the modification removes the dark appearance of the reduced polymer, while maintaining a low contact angle of water.

Using the teachings of the present invention, surface oxide species selectively produced in areas that have been irradiated can be utilized as chemical handles for further chemical modification. For example, there is considerable work in the literature on the use of organosilanes for functionalizing silicon oxide surfaces (e.g., this approach is used to make stationary phases for gas chromatographic columns).

It is an object of the present invention to remove discoloration associated with polymer reduction. Another object of the present invention is to improve the wetting characteristics (or work of adhesion) of fluoropolymer surfaces that have been reduced with standard methods. A still further object of the present invention is to enable light directed variations in the work of adhesion on surfaces using standard lithographic techniques.

Further features and advantages of the invention will become more readily apparent from the following detailed description when taken in conjunction with the accompanying drawings.

BRIEF DESCRIPTION OF THE DRAWINGS

FIGS. 7a is a microscopic image of a lithographic mask of FIG. 6. FIGS. 7b and 7c are microscopic images of modified poly(tetrafluoroethylene).

DETAILED DESCRIPTION

Figure 1:
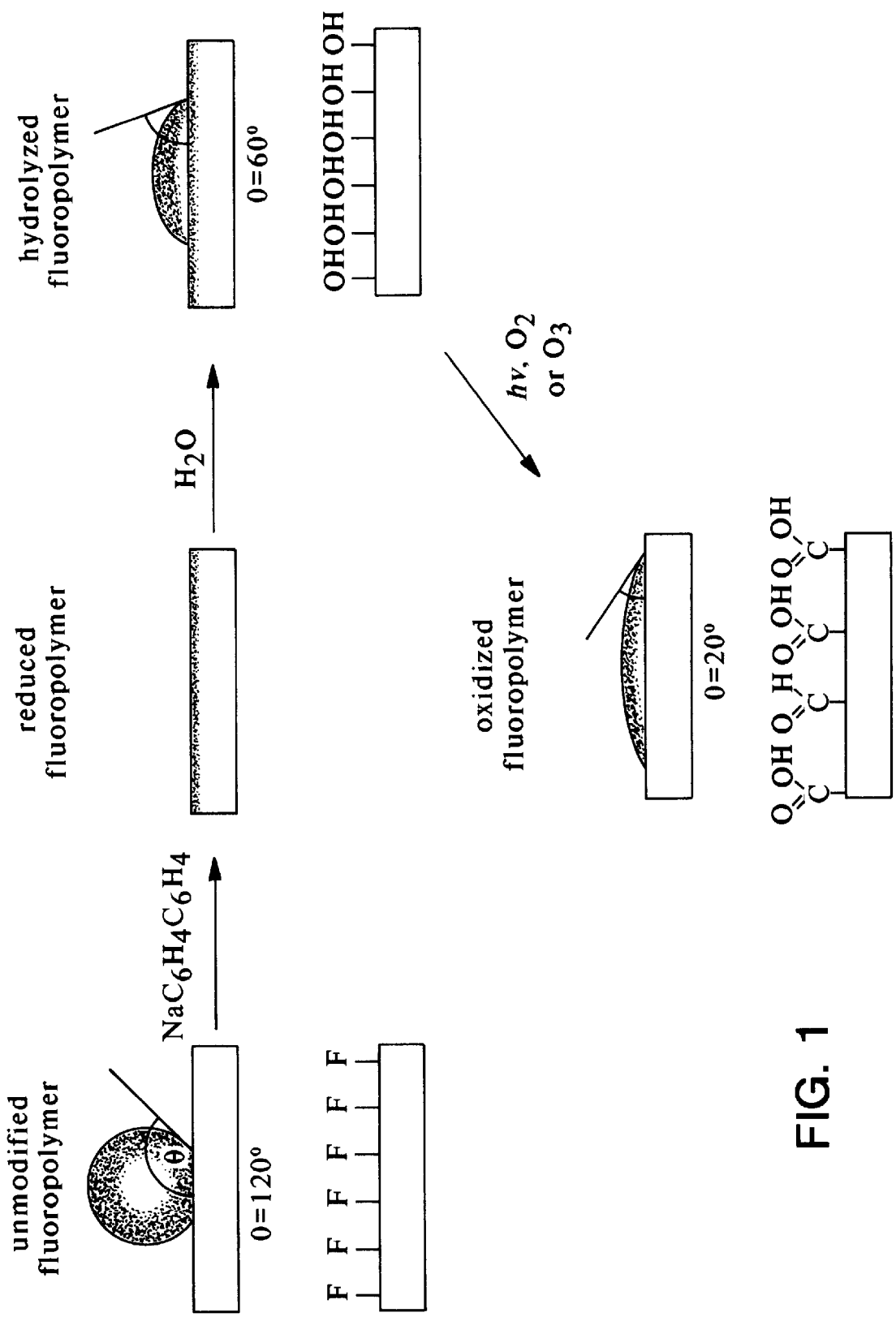
FIG. 1 is a schematic diagram illustrating the method of the present invention.

An illustrative embodiment of Applicant's invention is shown schematically in FIG. 1. The process involves a first step of the reduction of the fluoropolymer in a solution of sodium naphthalenide (reactive species) in diglyme (solvent). The resulting surface is then rinsed in a series of solvents of varying polarity concluding with a warm water rinse. This conventional modification step results in a dark surface due to the formation of double and triple bonds (i.e., reduction of the surface). In addition, this surface exhibits a lower advancing contact angle of water on the fluoropolymer which is characteristic of an increase work of adhesion. As will be demonstrated below, the reduced surface produced by this conventional procedure has a considerable amount of oxygen present on the surface, likely due to exposure of the reduced surface to water which may hydrolyze the surface.

Utilizing applicant's process, as illustrated in FIG. 1, the reduced/hydrolyzed surface is further exposed to ultraviolet (UV) radiation in the presence of oxygen or ozone. After irradiation, the surface of the reduced fluoropolymer becomes white, likely due to destruction of double and triple bonds. Further, the irradiated surface exhibits a significantly lower advancing contact angle of water (or significant increase in the work of adhesion). As will be demonstrated below, the decrease in advancing contact angle accompanies an increased oxidation of the surface.

Figure 2A:
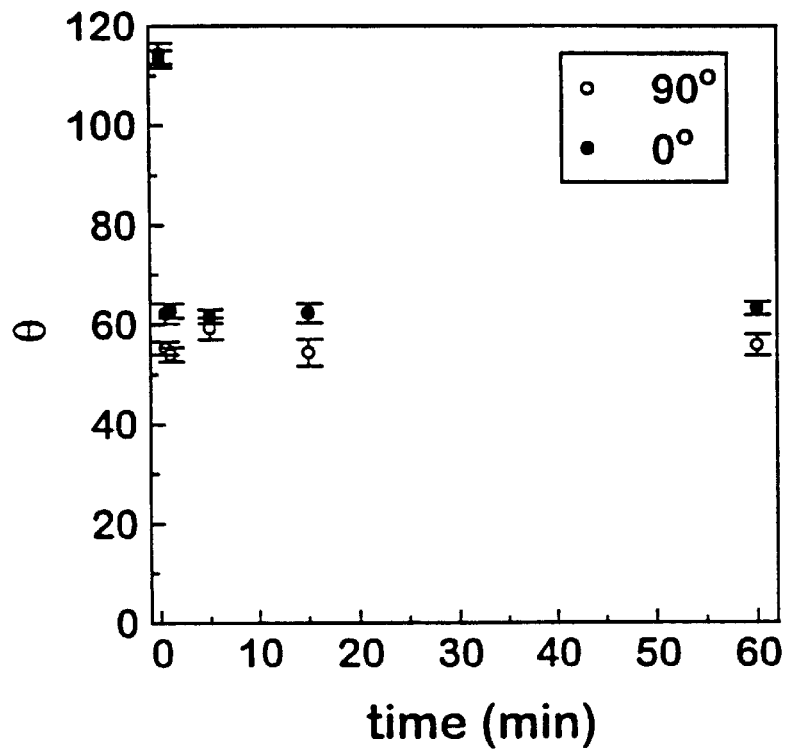
FIGS. 2a and 2b are graphs showing the advancing contact angle of water on pressed poly(tetrafluoroethylene) measured at 0 and 90 degrees with respect to surface.

FIG. 2 shows the effects of the modification steps in FIG. 1 on the advancing contact angle of water on pressed poly(tetrafluoroethylene). As shown in FIG. 2a, lowering of the advancing contact angle of water on poly (tetrafluoroethylene) occurs almost immediately upon exposure to a solution of sodium naphthalenide, while further lowering of the contact angle due to irradiation in the presence of air occurs over the period of 20 minutes. Further, the lowering of contact angle is not significantly effected by the scive marks present on the surface of the pressed poly(tetrafluoroethylene) film. FIG. 3 shows the surface roughness of the pressed poly(tetrafluoroethylene) films and the effect of reducing the surface in a solution of sodium naphthalenide. The scive marks are clearly evident in images in FIG. 3, however, surface roughness is increased significantly after reacting in the sodium naphthalenide solution.

Figure 2B:
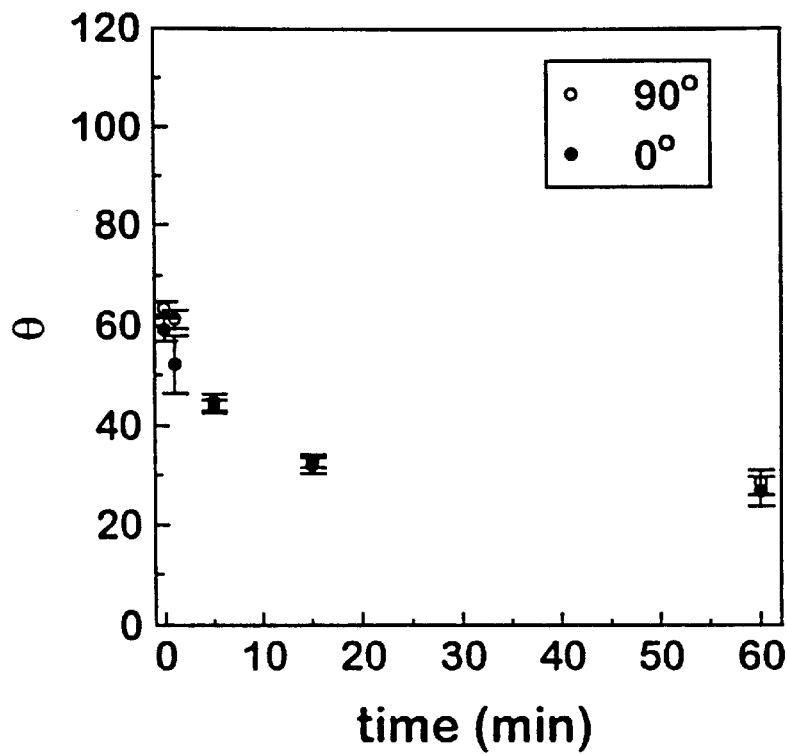
Figure 3A:
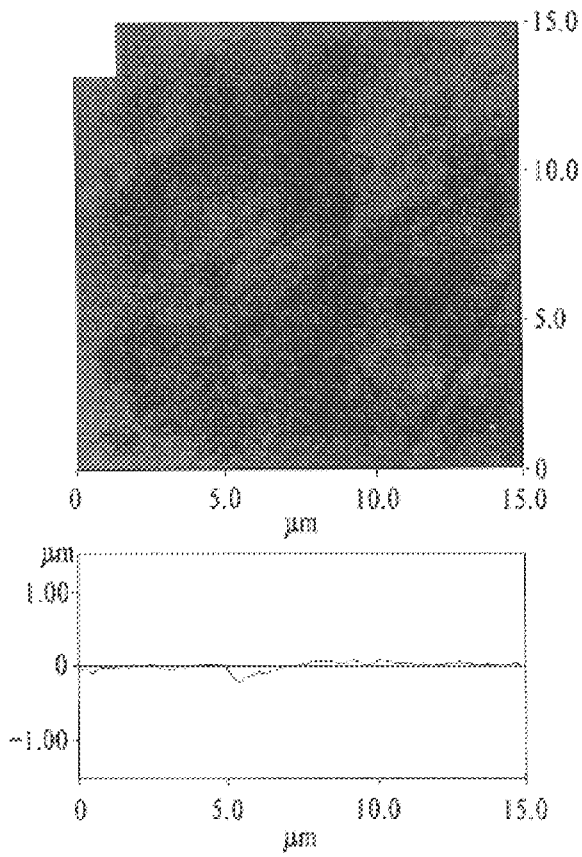
FIGS. 3a and 3b are atomic force microscope images of pressed poly(tetrafluoroethylene) before and after modification in sodium napthalenide.
Figure 3B:
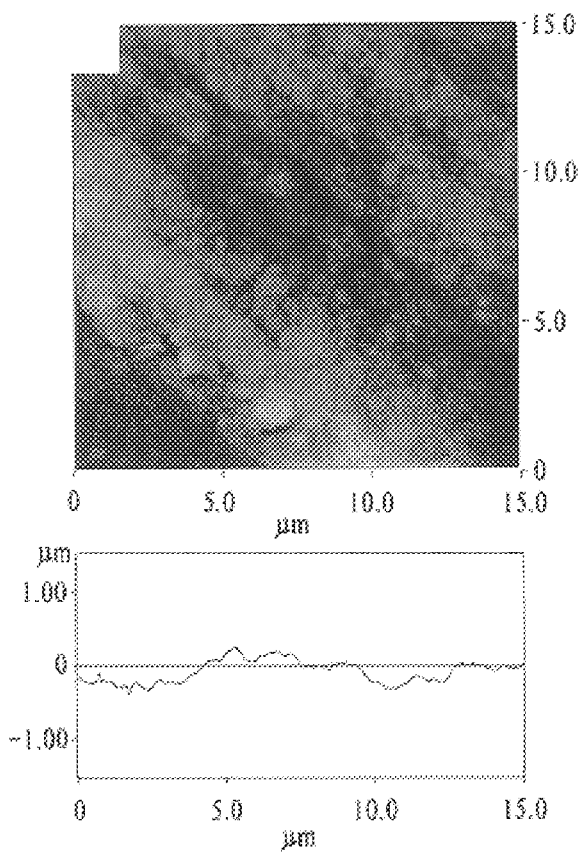
Figure 3C:
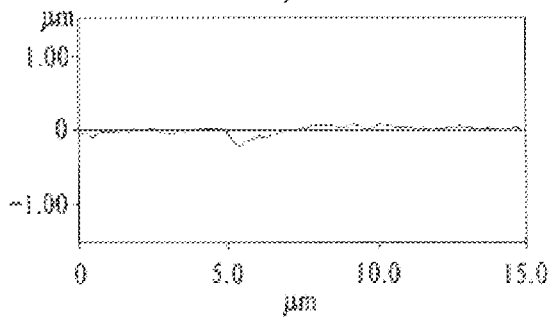
FIGS. 3c and 3d are graphs representing a cross section of FIGS. 3a and 3b.
Figure 3D:
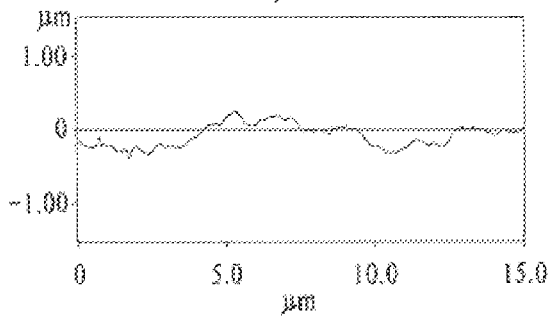
Figure 4:
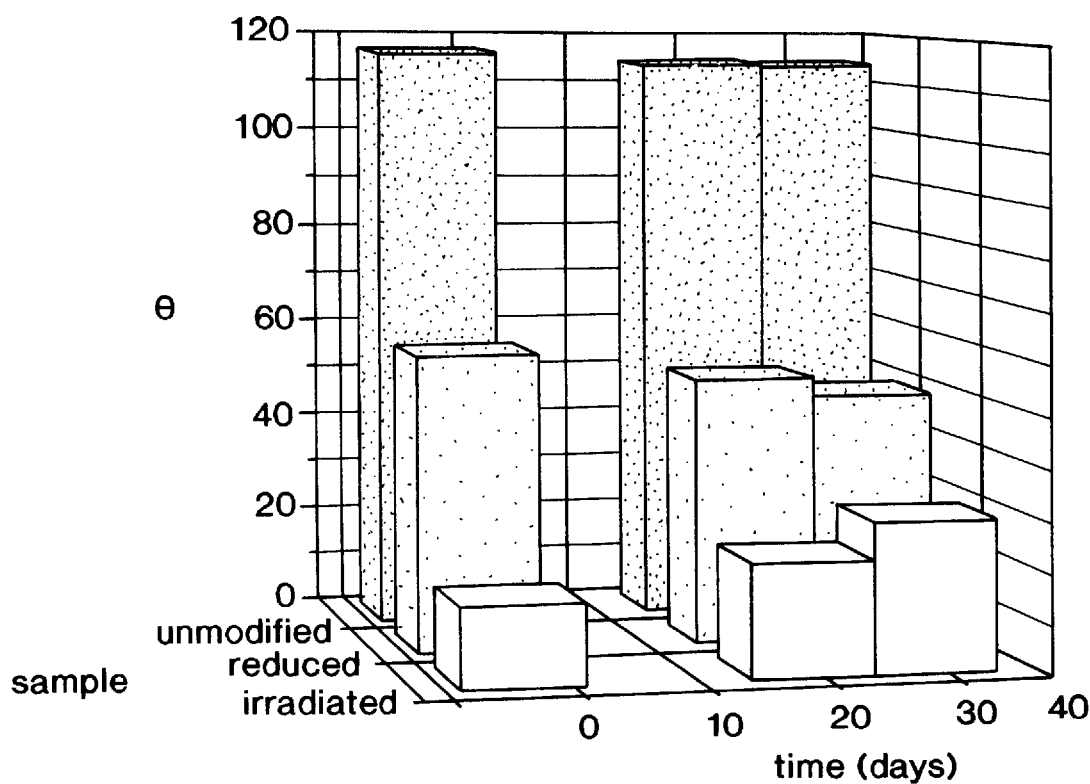
FIG. 4. is a table illustrating the advancing contact angle of water on different pressed poly(tetrafluroethylene) samples as a function of long-term stability of modified surfaces.

The long term stability of the surfaces produced by these modification steps is shown in FIG. 4 where the advancing contact angle of water was monitored for the period of a month. It is evident from FIG. 4 that although the contact angles changed no more than 10 degrees over the period of a month for any of the samples, there is a distinct decrease in contact angle of the reduced poly(tetrafluoroethylene) surface and a clear increase in contact angle of the irradiated sample. The role of oxygen or ozone was demonstrated by a series of experiments where reduced poly(tetrafluoroethylene) was irradiated with UV light in different environments. In these experiments, samples were irradiated in a pure nitrogen atmosphere, a nitrogen atmosphere saturated with water, in air (containing oxygen, nitrogen, and moisture), and in a UV-ozone cleaner. Only the environments that contained oxygen or ozone resulted in a noticeable decrease in contact angle as shown in FIG. 2b.

Figure 5A:
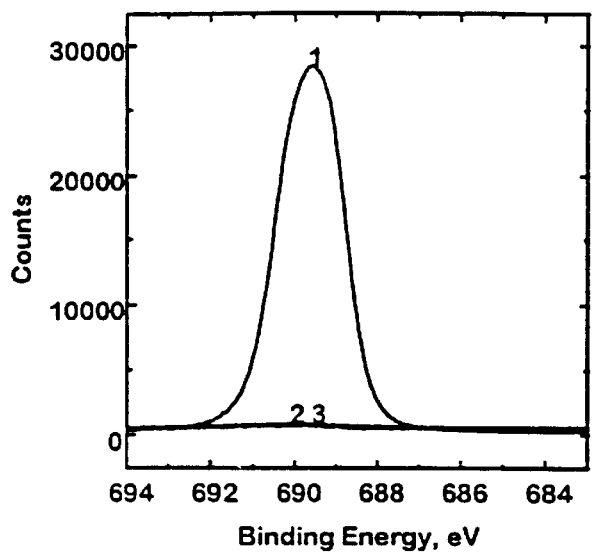
FIGS. 5a, 5b, and 5c are graphs showing X-ray photoelectron spectra.
Figure 5B:
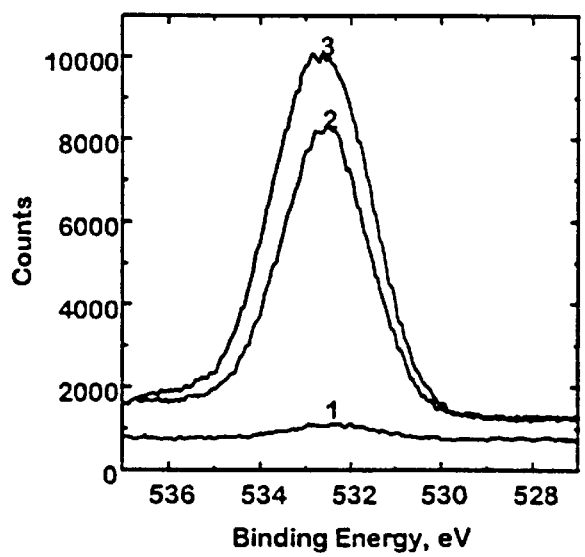
Figure 5C:
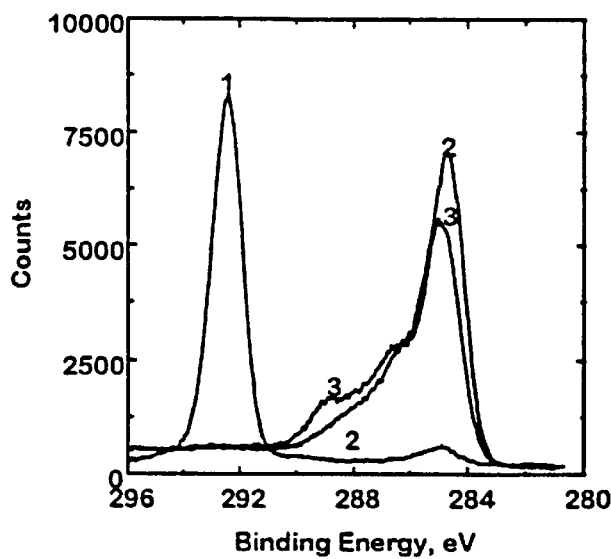
Figure 6:
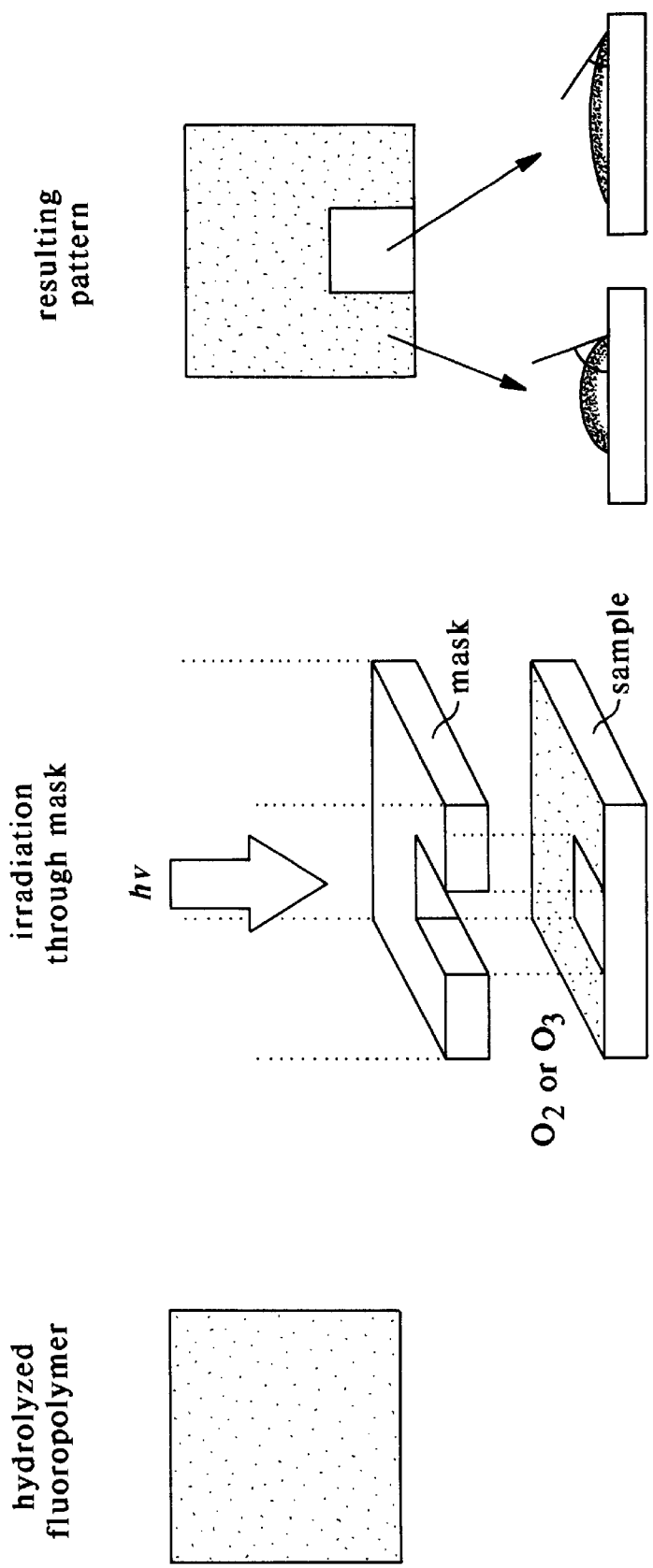
FIG. 6 is a schematic diagram illustrating a lithographic processing scheme of the present invention.

In addition, x-ray photoelectron spectroscopy was used to characterize the surface produced with modification. FIG. 5a is a graph showing x-ray photoelectron spectra of poly(tetrafluoroethylene), after modification in naphthalenide for 5 minutes, FIG. 5b after modification in naphthalenide for 5 min, and FIG. 5c after exposure to UV radiation for 40 min in taur. As expected, reduction of poly(tetrafluoroethylene) in the sodium naphthalenide solution resulted in removal of fluorine from the surface as indicated by the disappearance of the $F_{1s}$ peak in FIG. 5a and the disappearance of the $C_{1s}$ peak around 292 eV. FIG. 5b shows that the treatment in the sodium naphthalenide solution and subsequent rinsing results in the formation of oxygen containing species on the surface. Irradiation then results in an increase in the amount of oxygen on the surface as indicated by the increase in the $O_{1s}$ peak in FIG. 5b. FIG. 5c clearly demonstrates that in addition to the increase in surface oxygen, that there is an increase in the oxidation state of carbon on the surface as indicated by the appearance of shoulders on the $C_{1s}$ peak around 287 and 289. These results suggest that in addition to disruption of double bonds resulting from reaction with electronically excited oxygen, the ratio of carboxylic acid groups to hydroxyl groups may increase as a result of irradiation and lead to a more hydrophilic surface (i.e., lower contact angle). The fact that UV radiation is used in this modification procedure allows the chemical modification to be directed using a mask as in standard lithographic procedures. FIG. 6 illustrates how this can be accomplished with a fluoropolymer that has been initially reduced (with sodium naphthalenide solution for example).

The results of the approach in FIG. 6 is shown in FIG. 7 where a standard test mask was used to expose portions of a reduced poly(tetrafluoroethylene) surface. As seen in FIG. 7c, features down to 10 μm can be easily produced on pressed fluoropolymer surfaces.

To measure the strength of adhesion, block shear ASTM tests were performed using an Instron 4206 equipped with a steel holding block and shearing tool. 18 teflon blocks, approximately 3"×1"×½", were cleaned in acetonitrile, ethanol, acetone, tetrahydrofuran, and carbon tetrachloride as detailed earlier. Sodium naphthalene was used to reduce 17 of the samples in air for 30 seconds each. Reduced samples were immediately placed in methanol for 20 seconds, washed with the solvents mentioned above, placed in a 70° C. deionized water bath for 1 minute, dipped in carbon tetrachloride for 10 seconds, and blown dry. The imperfections and discolorations due to reduction were noted for all samples. Of the reduced samples, 11 were placed under the low pressure mercury lamp in air and removed after 5, 10, and 30 minutes of exposure.

Figure 8:
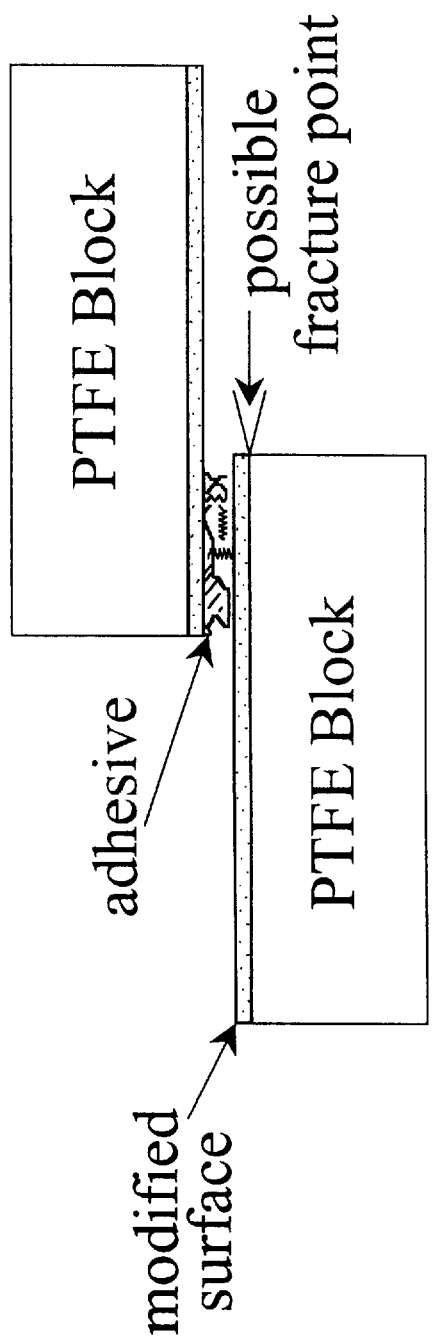
FIG. 8 is a schematic diagram of PFTE block samples prepared for block shear tensile test.

Loctite Prism 401 surface insensitive cyanoacrylate adhesive was used to bond the samples together. Half of the teflon samples were mounted on a plywood board equipped with small metal plates to secure each block in place. A few drops of adhesive were added to these 9 samples before being quickly covered with another teflon sample. The area of sample overlap was about 1"×1" (FIG. 8). All samples were paired with an identically prepared teflon sample, except for the unmodified/reduced and reduced/UV irradiated (30 minutes) pairs. The samples were dried overnight and then placed in the Instron 4206 with 1800 psi and 12.4 MPa.

Figure 9:
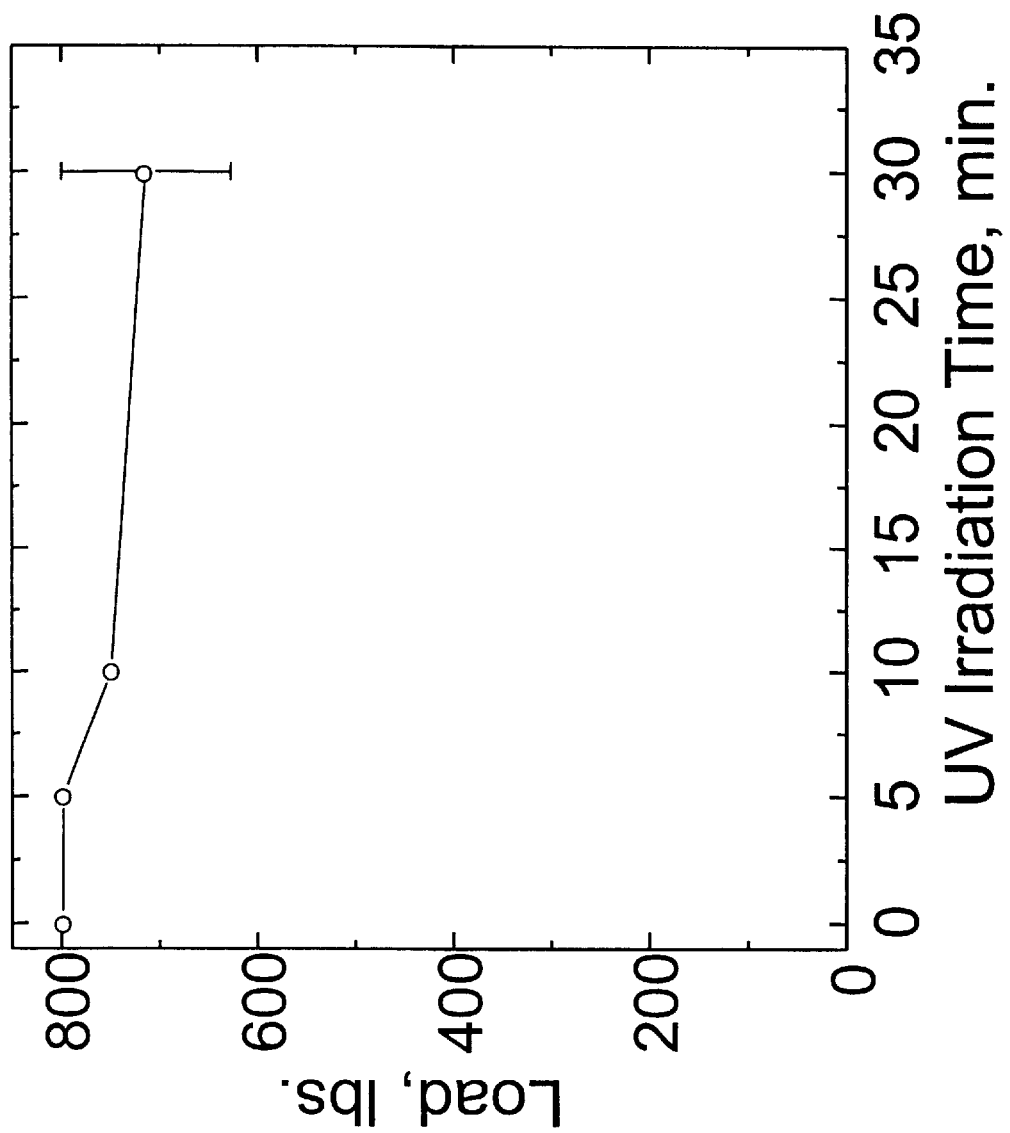
FIG. 9 shows a graph of applied load as a function of UV irradiation time.

FIG. 9 shows a graph of applied load as a function of UV irradiation time. The load applied decreases slightly as irradiation time increases, but not significantly. Some inconsistencies did exist with the samples. The unmodified sample adhered to the reduced sample fractured at the modified teflon/glue interface and was omitted from the graph. The nature of this fracture confirms that teflon has a low degree of adhesion. The only other sample were fracture occurred was the reduced sample adhered to the 30 minute irradiated sample. In this case, the break occurred at the modified teflon/teflon interface, indicated in FIG. 9. The data point was included with the other points of paired 30 minute irradiated samples, since, ultimately, the effect of irradiation is the factor being monitored. Since these imperfection only occurred for this one sample, it is not conclusive that UV exposure weakens the bond strength. From all other data points, it is found that the load required for failure does not decrease considerably, indicating that adhesive characteristics of teflon samples are not substantially lowered by UV irradiation treatment.

These results demonstrate that one can spatially control the work of adhesion on a fluoropolymer surface which will be extremely useful for the use of fluoropolymers in printed circuit boards. Current development is aimed at exploiting the different functional groups present on the irradiated and nonirradiated areas on the surface. For example, one should be able to tailor the surface chemistry in both areas for specific applications (i.e., binding metals, semiconductors, and insulator).

We claim:

1. A method of modifying the contact angle of water on a fluoropolymer surface, comprising the steps of:
    (a) providing a fluoropolymer surface;
    (b) adding a solution comprising a reactive species to said fluoropolymer surface to form a reduced fluoropolymer surface; and
    (c) exposing said reduced fluoropolymer surface to ultraviolet radiation in the presence of ozone.

2. A method of modifying the contact angle of water on a fluoropolymer surface, comprising the steps of:
    (a) providing a fluoropolymer surface;
    (b) adding a solution comprising a reactive species to said fluoropolymer surface to form a reduced fluoropolymer surface; and
    (c) exposing said reduced fluoropolymer surface to ultraviolet radiation in the presence of oxygen.

3. The method as defined by claim 1 wherein step (b) further comprises a step of adding water to the reduced fluoropolymer surface.

4. The method as defined by claim 2 wherein step (b) further comprises a step of adding water to the reduced fluoropolymer surface.

5. The method as defined by claim 3 wherein the solution comprises sodium naphthalenide in solvent.

6. The method as defined by claim 4, wherein the solution comprises sodium naphthalenide in solvent.

7. A method of modifying the work of adhesion on a fluoropolymer surface, comprising the steps of:

(a) providing a fluoropolymer surface;

(b) adding a solution comprising a reactive species to said fluoropolymer surface to form a reduced fluoropolymer surface; and (c) exposing said reduced fluoropolymer surface to ultraviolet radiation in the presence of ozone.

8. A method of modifying the work of adhesion on a fluoropolymer surface, comprising the steps of:

(a) providing a fluoropolymer surface;

(b) adding a solution comprising a reactive species to said fluoropolymer surface to form a reduced fluoropolymer surface; and (c) exposing said reduced fluoropolymer surface to ultraviolet radiation in the present of oxygen.

9. A method of modifying the adhesion of water on a fluoropolymer surface, comprising the steps of:

(a) providing a fluoropolymer surface;

(b) adding a solution comprising a reactive species to said fluoropolymer surface to form a reduced fluoropolymer surface; and (c) exposing said reduced fluoropolymer surface to an oxidizing agent.

10. A method of modifying the adhesion of water on a fluoropolymer surface, comprising the steps of:

(a) providing a fluoropolymer surface;

(b) adding a solution comprising a reactive species to said fluoropolymer surface to form a reduced fluoropolymer surface; and (c) breaking bonds on the surface of the reduced fluoropolymer surface.

11. A method of reducing the discoloration of a fluoropolymer, comprising the steps of:

(a) providing a fluoropolymer;

(b) adding a solution comprising a reactive species to said fluoropolymer surface to form a reduced fluoropolymer surface; and (c) exposing said reduced fluoropolymer surface to ultraviolet radiation in the presence of ozone.

12. A method of reducing the discoloration of a fluoropolymer, comprising the steps of:

(a) providing a fluoropolymer;

(b) adding a solution comprising a reactive species to said fluoropolymer surface to form a reduced fluoropolymer surface; and (c) exposing said reduced fluoropolymer surface to ultraviolet radiation in the presence of oxygen.

13. The method as defined by claim 11 wherein step (b) further comprises a step of adding water to the reduced fluoropolymer surface.

14. The method as defined by claim 12 wherein step (b) further comprises a step of adding water to the reduced fluoropolymer surface.

15. The method as defined by claim 13 wherein the solution comprises sodium naphthalenide in solvent.

16. The method as defined by claim 14, wherein the solution comprises sodium naphthalenide in solvent.

* * * * *